(12) United States Patent
Takabayashi et al.

(10) Patent No.: US 7,248,643 B2
(45) Date of Patent: Jul. 24, 2007

(54) DISTORTION COMPENSATOR

(75) Inventors: Shinichiro Takabayashi, Yokosuka (JP); Masato Ukena, Yokosuka (JP); Masayuki Orihashi, Ichikawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 427 days.

(21) Appl. No.: 10/502,512

(22) PCT Filed: Jun. 4, 2003

(86) PCT No.: PCT/JP03/07064

§ 371 (c)(1),
(2), (4) Date: Jul. 23, 2004

(87) PCT Pub. No.: WO03/105336

PCT Pub. Date: Dec. 18, 2003

(65) Prior Publication Data

US 2005/0213685 A1    Sep. 29, 2005

(30) Foreign Application Priority Data

Jun. 5, 2002  (JP)  ............................. 2002-163950
May 7, 2003  (JP)  ............................. 2003-128756

(51) Int. Cl.
  *H04K 1/02*    (2006.01)
  *H04B 1/04*    (2006.01)
  *H04B 3/46*    (2006.01)
  *H04L 27/00*   (2006.01)
  *H03H 7/30*    (2006.01)

(52) U.S. Cl. ....................... 375/296; 455/126; 375/295; 375/232; 375/224

(58) Field of Classification Search ................ 375/296, 375/224, 232, 285, 254
See application file for complete search history.

(56) References Cited

U.S. PATENT DOCUMENTS 6,236,837 B1    5/2001    Midya (Continued)

FOREIGN PATENT DOCUMENTS

EP    0 928 062    7/1999

(Continued)

OTHER PUBLICATIONS

International Search Report for PCT/JP2003/07064, dated Oct. 9, 2003.

*Primary Examiner*—Mohammed Ghayour
*Assistant Examiner*—Nurul M Matin
(74) *Attorney, Agent, or Firm*—RatnerPrestia (57) ABSTRACT

A coefficient computing section, for computing a characteristic reverse to an input/output characteristic of the power amplifier, is configured by a fixed coefficient storing section and an error coefficient computing section. The fixed coefficient storing section is previously stored with the characteristic reverse to a pre-measured input/output characteristic. The error coefficient computing section computes an error coefficient between a characteristic stored in the fixed coefficient storing section and a current characteristic of the power amplifier. When the determining section determines that the adjacent-channel leak current power ratio is greater than a predetermined value, an operation halt is instructed to the power amplifier.

6 Claims, 6 Drawing Sheets

U.S. PATENT DOCUMENTS

| | | | |
|---|---|---|---|
| 6,400,774 B1 * | 6/2002 | Matsuoka et al. | 375/295 |
| 6,400,775 B1 * | 6/2002 | Gourgue et al. | 375/296 |
| 6,766,151 B2 * | 7/2004 | Kusunoki | 455/114.3 |
| 6,909,756 B1 * | 6/2005 | Nakajima | 375/296 |
| 6,915,118 B2 * | 7/2005 | Matsuoka | 455/126 |
| 7,020,447 B2 * | 3/2006 | Nagatani et al. | 455/114.3 |

FOREIGN PATENT DOCUMENTS

| | | |
|---|---|---|
| EP | 1 193 866 A | 4/2002 |
| JP | 10-150394 | 6/1998 |
| JP | 2000-278190 | 10/2000 |
| WO | WO 00/01065 | 1/2000 |

* cited by examiner

DISTORTION COMPENSATOR

THIS APPLICATION IS A U.S. NATIONAL PHASE APPLICATION OF PCT INTERNATIONAL APPLICATION PCT/JP2003/07064.

TECHNICAL FIELD

The present invention relates to a distortion compensator for compensating a non-linear distortion as caused on a power amplifier used in a radio-communication system's transmitter.

BACKGROUND ART

Figure 5:
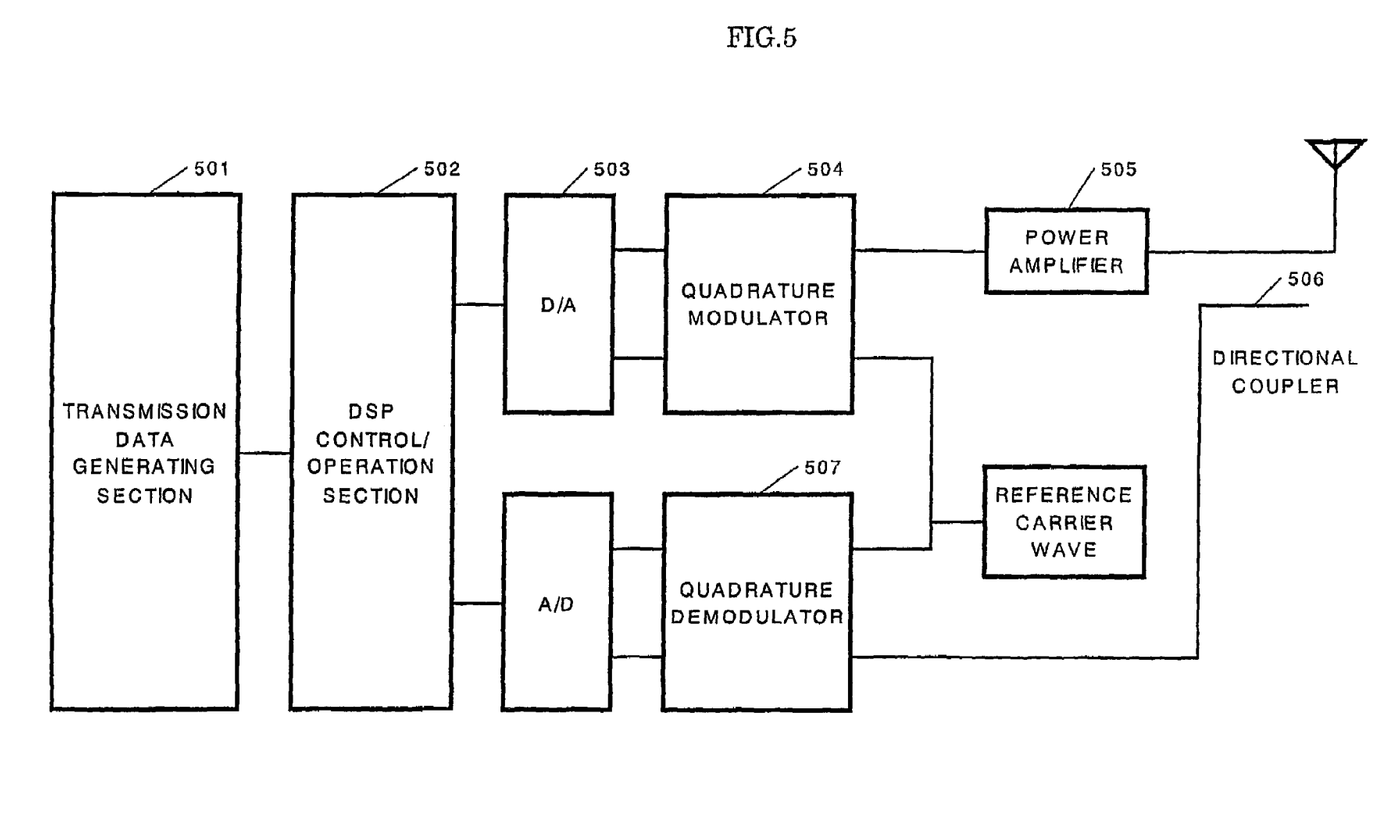
FIG. 5 shows a block diagram of a conventional non-linear distortion compensator.

Conventionally, the distortion compensators of this kind include those as described in JP-A-2000-278190. FIG. 5 shows a conventional distortion compensator described in JP-A-2000-278190.

In FIG. 5, the data from the data generating section 501 is processed with pre-distortion by a control/operation section 502, that is a DSP, then being sent out through a digital-analog converter 503, an quadrature modulator 504 and a power amplifier 505. A part of the transmission wave is inputted to an quadrature demodulator 507 through a directional coupler 506. An quadrature demodulator 507 demodulates the digital signal and inputs it to the control/operation section 502. The control/operation section 502 compares the amplitude and phase of between a digital signal to send out and a feedback signal obtained by demodulating the sending output of the digital signal, and operation-estimates a distortion over the transmission circuit and creates a compensation table, according to an IMS scheme or the like. Thus, the transmission digital signal is processed with pre-distortion.

Figure 6:
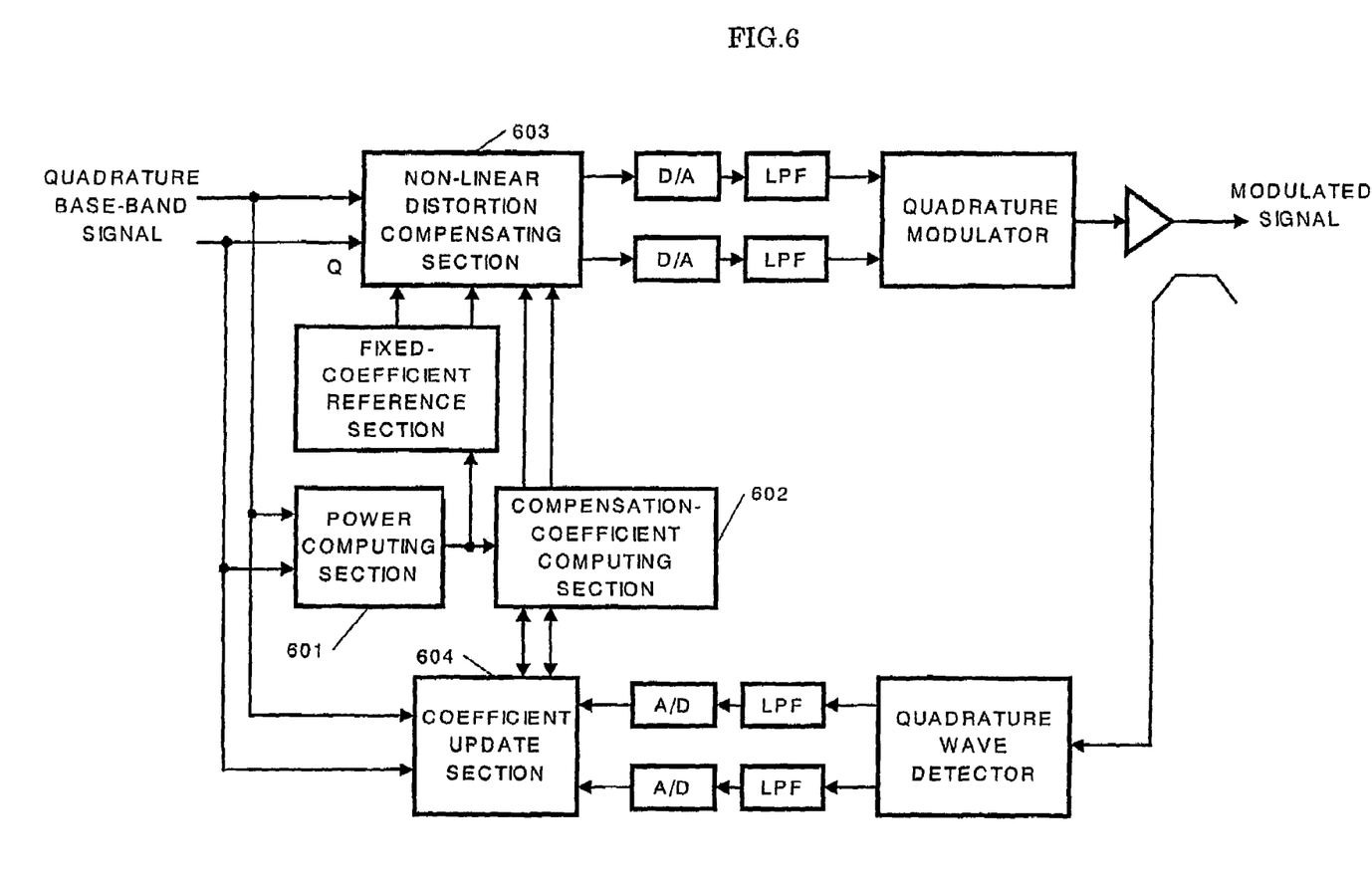
FIG. 6 shows a block diagram of a conventional non-linear distortion compensator.

Meanwhile, there are those described in JP-A-10-150394, as the conventional distortion compensators that compensate for a non-linear distortion caused on a transmission-system amplifier without using a storage table for storing the compensation coefficient to compensate for a non-linear distortion component. FIG. 6 shows a conventional distortion compensator described in JP-A-10-150394.

In FIG. 6, a power computing section 601 determines a signal power from an inputted quadrature base-band signal. Then, a compensation-coefficient computing section 602 computes a distortion compensating coefficient by the use of an approximate equation having that value as a parameter. By using it, a non-linear distortion compensating section 603 compensates for a non-linear distortion. Using an error between an quadrature signal obtained by demodulating an output to which the modulation output is distributed as well as an quadrature base-band signal, a coefficient update section 604 updates the coefficient of the approximate equation.

Furthermore, in order not to send out an abnormal signal from the antenna in the event of a failure of the power amplifier, the conventional distortion compensator is configured to monitor the output power of the power amplifier. When a power value exceeding a pre-defined value is detected, the power amplifier is ceased in operation.

However, in the conventional configuration disclosed in JP-A-2000-278190, there is a need of large sizes of coefficient tables to express a distortion characteristic of the power amplifier. Furthermore, the frequency of coefficient update is still-high, resulting in a problem of time increase before attaining convergence.

Meanwhile, in the conventional structure disclosed in JP-A-10-150394, the quadrature base-band signal to transmit is used as an input to the distortion compensator so that a distortion compensation coefficient is determined by a comparison between this signal and the quadrature base-band signal fed back from the power amplifier output. However, in order to realize the equivalent operation and function where an RF signal is used as an input to a distortion compensator, the RF signal must be down-converted and then subjected to quadrature demodulation, thus involving a problem of complication in configuration.

Furthermore, in the conventional configuration, when abnormality occurs in the distortion amount on the power amplifier in an absent state of abnormality in the output power value, it cannot be coped with by the distortion compensator. Thus, there exists a drawback unable to prevent the interference to the adjacent channel.

DISCLOSURE OF THE INVENTION

A distortion compensator of the invention is characterized by configuring a coefficient computing section, by a fixed coefficient storing section and an error coefficient computing section, to compute a characteristic reverse to an input/output characteristic of the power amplifier. The fixed coefficient storing section is previously stored with the characteristic reverse to a pre-measured input/output characteristic. The error coefficient computing section computes an error coefficient between a characteristic stored in the fixed coefficient storing section and a current characteristic of the power amplifier. Because of satisfactorily measuring an error, the number of coefficient updates is reduced as compared to that of a configuration having only a coefficient measuring section.

Meanwhile, when the power amplifier is faulty and the amount of distortion caused is greater than a reference, an out-band power computing section detects that fact and outputs a control signal to the power amplifier, thereby halting the operation of the power amplifier.

Meanwhile, a distortion compensator of the invention comprises: an amplitude phase control section for controlling an amplitude and phase of a transmission base-band signal; an quadrature modulating section for orthogonally modulating an output of the amplitude phase control section; a power amplifier for amplifying an output of the quadrature modulating section; a directional coupler for distributing an output of the power amplifier; a frequency converter for frequency-converting one of outputs of the directional coupler; a Fourier transform section for Fourier-transforming an output of the frequency converter; an out-band power computing section for computing an out-band power from an output of the Fourier transform section; an amplitude computing section for computing an amplitude value of the transmission base-band signal; a coefficient computing section for computing a characteristic reverse to input/output characteristic of the power amplifier on the basis of the amplitude value and notifying the amplitude phase control section of a change amount of amplitude and phase for the transmission base-band signal; a fixed-coefficient storing section for storing a characteristic reverse to a pre-measured input/output characteristic of the power amplifier; an error coefficient computing section for computing an error characteristic from a stored characteristic in the fixed coefficient storing section, on the basis of an output of the out-band power measuring section; and an amplitude phase change amount computing section for computing a change amount of amplitude and phase on the basis of outputs of the fixed coefficient storing section and error coefficient computing section, and instructing the amplitude phase control section to carry out the control on the basis of the change amount of amplitude and phase. This enables-the adapting operation to follow up the characteristic variation on the power amplifier. Furthermore, as compared to the distortion compensator having only a coefficient computing section requiring to update several tens to several hundreds of memory, it is satisfactory to update several polynomial coefficients representative of an error characteristic. Thus, the number of times of coefficient updates can be greatly reduced.

Also, a distortion compensator of the invention comprises: a variable attenuator for controlling an amplitude of a transmission RF signal; a variable-phase unit for controlling a phase on an output of the variable attenuator; a power amplifier for amplifying an output of the variable phase unit; a directional coupler for distributing an output of the power amplifier; a frequency converter for frequency-converting one of outputs of the directional coupler; a Fourier transform section for Fourier-transforming an output of the frequency converter; an out-band power computing section for computing an out-band power from an output of the Fourier transform section; an envelope detecting section for outputting an amplitude value of an envelope on the transmission RF signal; a fixed coefficient storing section for storing a characteristic reverse to a pre-measured input/output characteristic of the power amplifier; an error coefficient computing section for computing an error characteristic of from a stored characteristic in the fixed coefficient storing section, on the basis of an output of the out-band power measuring section; and an amplitude phase change amount computing section for computing a change amount of amplitude and phase on the basis of outputs of the fixed coefficient storing section and error coefficient computing section, and instructing the variable attenuator and variable phase unit to carry out the control on the basis of the change amount of amplitude and phase. This enables the adapting operation to follow up the characteristic variation on the power amplifier. Furthermore, as compared to the distortion compensator having only a coefficient computing section requiring to update several tens to several hundreds of memory, it is satisfactory to update several polynomial coefficients representative of an error characteristic. Thus, in operation, the number of times of coefficient updates can be greatly reduced.

Also, the error coefficient computing section of the distortion compensator of the invention is to compute a polynomial having, as a variable, an amplitude value of a transmission base-band signal or transmission RF signal, to update a coefficient of the polynomial from the out-band power. Due to this, error coefficient expression can be by a polynomial having as a variable an amplitude value instead of by a table having as an address an amplitude value, thereby reducing the number of times of updating the adapting operation and shorten the convergence time. Furthermore, because the polynomial coefficient is updated depending upon a characteristic change of the power amplifier, distortion compensation characteristic is available even against the input/output characteristic change to/from power amplifier caused by environmental variation or a request from the communication system.

Also, the out-band power computing section of the distortion compensator of the invention has a power computing section for computing an adjacent channel leak power ratio and a determining section for determining whether the adjacent channel leak power ratio is equal to or smaller than a predetermined value or not, to instruct the power amplifier to halt operation when the adjacent channel leak power ratio is greater than the predetermined value. Due to this, monitoring is possible at all times as to whether the transmitter satisfies a given specification or not. In the event of a departure from the specification, the power amplifier is halted in operation. Thus, it is possible to prevent radio wave radiation impedimental to the adjacent channel.

As described above, with the present invention, it is possible to reduce the number of times of updating the coefficient for distortion compensation, rapidly converge the adapting operation to follow up the characteristic fluctuation of a power amplifier and prevent the interference to the adjacent channel due to abnormal distortion on the power amplifier.

BEST MODE FOR CARRYING OUT THE INVENTION

Now embodiments of the resent invention will be explained with using the drawings.

EMBODIMENT 1

Figure 1:
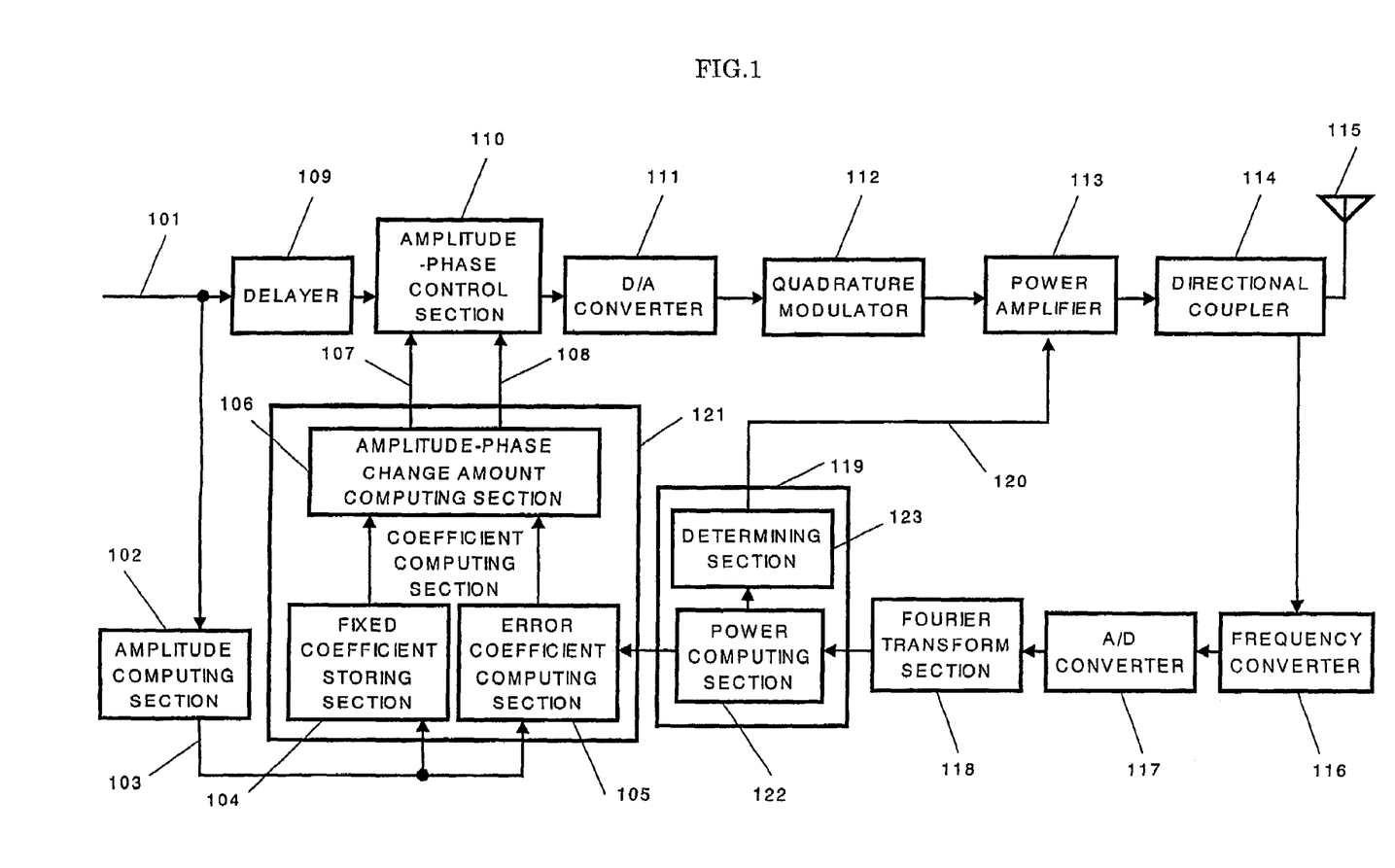
FIG. 1 shows a block diagram of an adaptation-type distortion compensator according to embodiment 1 in the present invention.

FIG. 1 is a block diagram of a distortion compensator according to an embodiment of the present invention. An amplitude computing section 102 is to compute an amplitude value 103 of a transmission base-band signal 101. A coefficient computing section 121 is to compute an amplitude change amount 107 and phase change amount 108, from an amplitude value 103 and out-band power computing section 119. Herein, the coefficient computing section 121 is explained by using the drawings.

Figure 3:
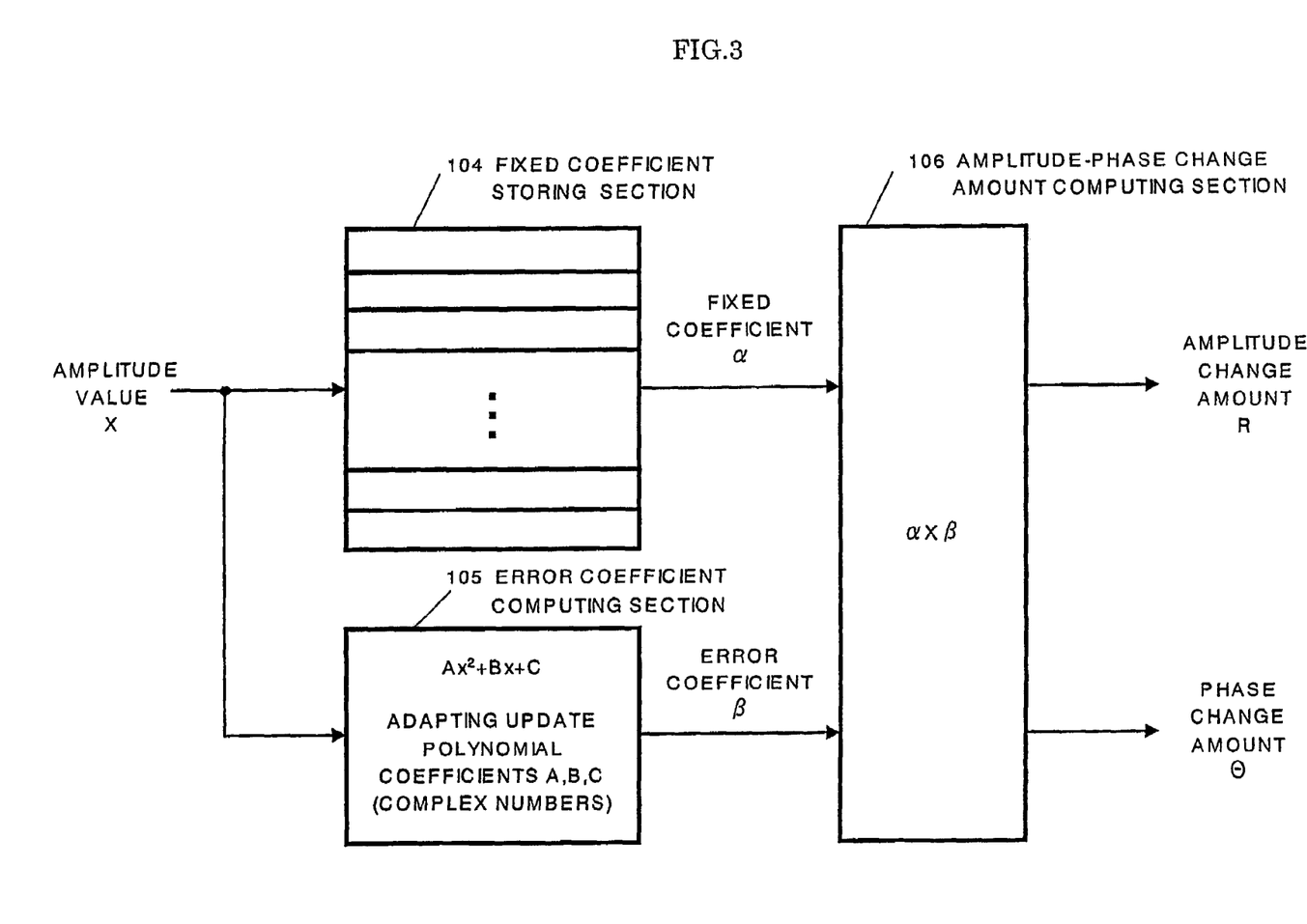
FIG. 3 shows a block diagram of a coefficient computing section according to embodiment 1 and 2 in the invention.

FIG. 3 is a block diagram showing a configuration of the coefficient computing section 121. In FIG. 3, a fixed-coefficient storing section 104 has a memory storing a coefficient for the characteristic reverse to a pre-measured input/output characteristic of a power amplifier 113, to compute a fixed coefficient α on the basis of an amplification value X as a parameter. Meanwhile, the error-coefficient computing section 105 is to compute a low-degree polynomial $(Ax^2+Bx+C)$ for computing a error coefficient β from the amplitude value X. An amplitude-phase change amount computing section 106 is to compute an amplitude change amount (R) 107 and phase change amount (θ) 108, on the basis of a multiplied value of the output of fixed-coefficient storing section 104 and the output of error coefficient computing section 105.

Meanwhile, a delayer 109 is to delay a transmission base-band signal by a predetermined time. An amplitude-phase control section 110 is to control the amplitude and phase of an input signal, according to the amplitude change amount 107 and phase change amount 108. A D/A converter 111 is to convert an input digital signal into an analog signal while an quadrature modulator 112 is to-carry out quadrature modulation.

A power amplifier 113 is to amplify the power of an input signal. A directional coupler 114 is to distribute the input signal into two signals while an antenna 115 is to radiate radio waves.

A frequency converter 116 is to down-convert the input signal into an intermediate-frequency band (IF band) or base band. An A/D converter 117 is to convert an input analog signal into a digital signal while a Fourier transform section 118 is to carry out a Fourier transform on the input signal, to output a frequency spectrum.

A out-band power computing section 119 is configured with a power computing section 122 for computing an integration power at an outer frequency range of a transmission modulation signal band and an adjacent-channel leak power ratio and a determining section 123 for determining whether a specification required for the communication system is satisfied or not.

Concerning the fixed-coefficient storing section 104 shown in FIG. 3, there is a method to pre-measure a coefficient for a characteristic reverse to an input/output characteristic of the power amplifier 113 and then store that coefficient in a memory. With this method, it is satisfactory to merely read out the coefficient stored in the memory by the use of an amplitude value 103, outputted from the amplitude computing section 102 as an address, requiring less operation amount. Another realization method is to previously express, in a polynomial form, the characteristic reverse to an input/output characteristic of the power amplifier 113. The degree of polynomial is determined for full approximation to the input/output characteristic of the power amplifier 113. This method, despite requiring polynomial operation, has a merit not requiring a large capacity of memory.

Meanwhile, the error-coefficient computing section 105 is realized by expressing, by a polynomial, an error coefficient for an error between a coefficient stored in the fixed-coefficient storing section 104 and a coefficient for a characteristic reverse to a current input/output characteristic of the power amplifier 113. This error coefficient, varying in time, is updated by adapting operation as hereinafter referred. This configuration, because the error-coefficient computing section 105 satisfactorily expresses an error coefficient, requires a reduced degree of polynomial, e.g. degree 1 to degree 2.

Explanation is made on the operation of the distortion compensator configured as above, by using FIGS. 1 and 3. At first, receiving a transmission base-band signal 101, the amplitude computing section 102 outputs an amplitude value 103 thereof. Receiving the amplitude value 103, the fixed-coefficient storing section 104 of the coefficient computing section 121 outputs a fixed coefficient in accordance with the amplitude value 103. Meanwhile, receiving the amplitude value 103 and the integration power from out-band power computing section 119, the error-coefficient computing section 105 computes and outputs an error coefficient corresponding to an error of between a fixed coefficient to be outputted from the fixed-coefficient storing section 104 and a coefficient for a characteristic reverse to a current output of the power amplifier 113. This error is representative of a change amount in input/output characteristic of the power amplifier 113 caused by environmental variation such as temperature, power voltage, aging and so on. Receiving the fixed coefficient and the error coefficient, the amplitude-phase change amount computing section 106 outputs an amplitude change amount 107 and phase change amount 108.

Meanwhile, the transmission base-band signal 101 is given a suitable delay amount by the delayer 109, and then inputted to the amplitude-phase control section 110. Herein, the delay given by the delayer 109 is in an amount of processing time on the transmission base-band signal. 101 passing the amplitude computing section 102, the fixed-coefficient storing section 104, error-coefficient computing section 105 and the amplitude-phase change amount computing section 106 and reaching the amplitude-phase control section 110. The delayed base-band signal, in the amplitude-phase control section 110, is controlled in amplitude and phase by the utilization of the amplitude change amount 107 and phase change amount 108. The signal controlled in amplitude and phase is converted by the D/A converter 111 into an analog signal, and then up-converted by the quadrature modulator 112 into a desired frequency. The frequency-converted signal is amplified by the power amplifier 113 to a desired power value, thus being turned into a distortion-offset linear signal. This signal is distributed by the directional coupler 114, one of whose output signals is sent out as a radio wave from at antenna 115.

The other output signal of the directional coupler 114 is down-converted by the frequency converter 116 into an intermediate frequency band (IF band) or base band. The down-converted signal is converted by an A/D converter 117 into a digital signal. The Fourier converting section 118 Fourier-converts the converted signal, to output a frequency spectrum. Receiving the frequency spectrum, the out-band power computing section 119 computes an outer frequency range power in a transmission frequency signal band. Herein, the distortion component caused on the power amplifier 113 appears as an out-band frequency component. Accordingly, the amount of a distortion caused on the power amplifier 113 can be known by computing a power through integrating out-band frequency spectrums. Otherwise, an adjacent-channel leak power ratio may be computed by and outputted from the out-band power computing section 119. The adjacent-channel leak power ratio can be determined by computing a ratio of an integration of frequency spectrums in the transmission modulation signal band and an integration of frequency spectrums in the adjacent-channel band.

The integration power outside the transmission modulation signal band is inputted to the error-coefficient computing section 105, whereby the foregoing error coefficient is updated by adapting operation. The error coefficient is updated such that the out-band power value outputted from the out-band power computing section 119 or the adjacent-channel leak power ratio becomes smaller in value.

Meanwhile, the error-coefficient expression is realized by a low-degree polynomial, as noted before. The polynomial coefficient is updated by adapting operation based on out-band power.

Now explanation is made on the adapting operation to update the polynomial coefficient.

Figure 4:
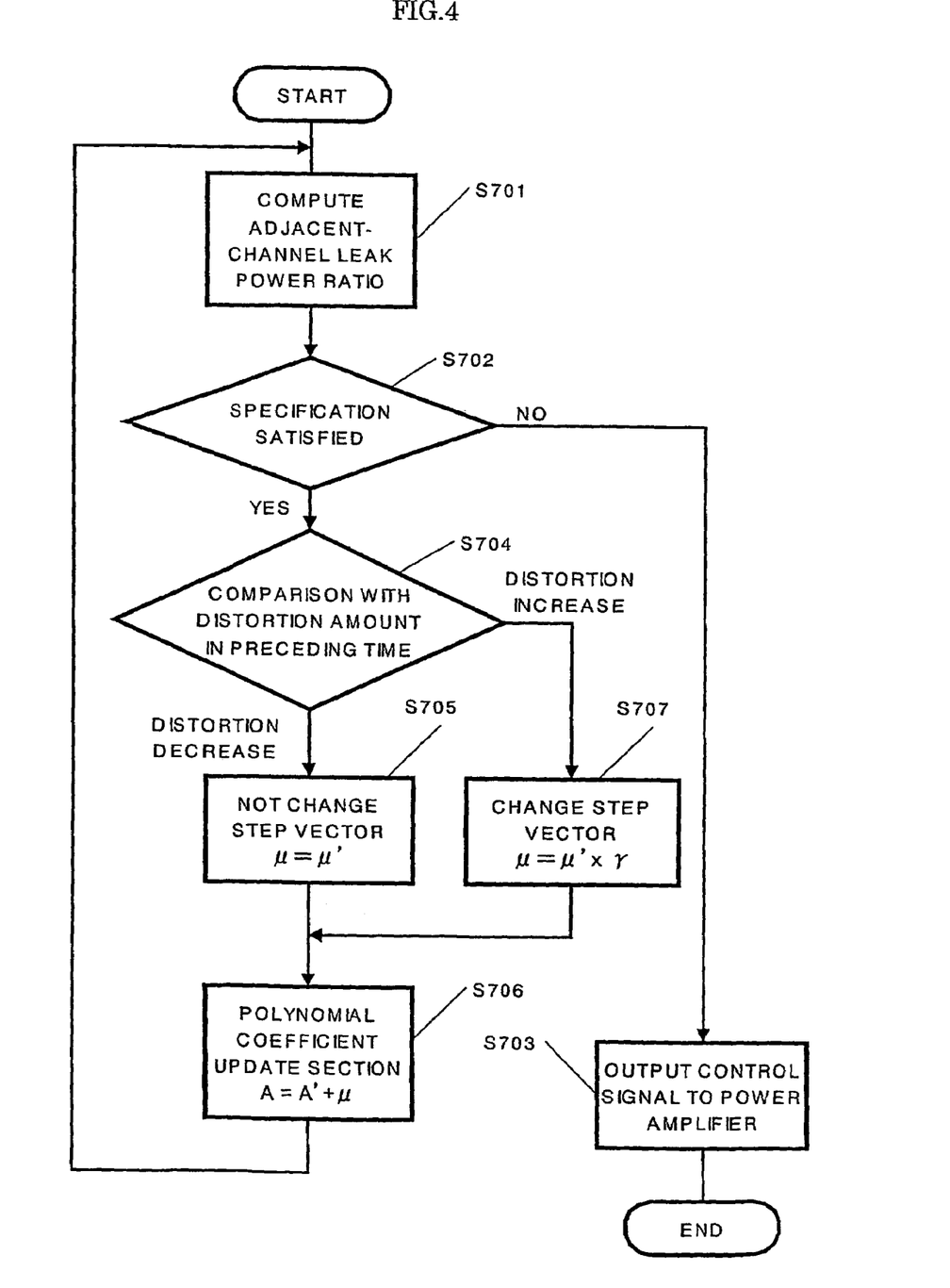
FIG. 4 is a flowchart showing a process to update the coefficient of a polynomial of an error coefficient computing section according to embodiment 1 and 2 of the invention.

FIG. 4 is a flowchart showing a process to update, from a frequency spectrum signal, the polynomial coefficient of a polynomial in the error-coefficient computing section.

At first, the power computing section 122 computes an adjacent-channel leak power ratio from a frequency spectrum signal outputted from the Fourier transform section 118 (step S701).

Next, the determining section 123 determines whether the computed adjacent-channel leak current ratio satisfies the specification required in the system or not (step S702). In the case the specification is not satisfied, a control signal for halting the operation is outputted to the power amplifier 113 (step S703).

When the specification is satisfied, the error-coefficient computing section 105 is notified the adjacent-channel leak power ratio. The error-coefficient computing section 105 compares the adjacent-channel leak power ratio with the distortion amount in the preceding time (step S704). In the case of a decrease in distortion, the step vector μ is not changed but set with the same value (step S705), thereby updating the polynomial coefficient (step S706).

Meanwhile, in the case of an increase in distortion, the step vector μ' is multiplied by a predetermined constant γ to thereby change the step vector μ (step S707), and then the process moves to step S706.

The process of the steps S701 to S707 is repeated to thereby update all the coefficients of polynomial. By thus updating the coefficients in the error-coefficient computing section 105, a favorable error compensation characteristic is available even against the input/output characteristic change of the power amplifier 113 due to environmental variation or a request from the communication system. Incidentally, such environmental variation includes temperature change, aging and so on, while request from the communication system includes carrier frequency change, transmission power change and so on.

As described above, the coefficient computing section 121, for computing a characteristic reverse to an input/output characteristic of a power amplifier, is configured by the fixed-coefficient storing section 104 and the error-coefficient computing section 105. Due to this, as compared to the configuration in which the coefficient computing section makes a computation with one polynomial, update is satisfactorily made to the lower-degree coefficient of polynomial. Consequently, because the number of updates can be reduced, rapid converge is possible on adapting operation.

Meanwhile, in the out-band power computing section 119, the power computing section 122 computes an adjacent-channel leak power ratio from a frequency spectrum as an output signal of the power amplifier 113, while the determining section 123 always determines whether satisfied is a specification required in the system or not. In the case of a determination the power amplifier 113 is faulty and an abnormal signal is outputted, the determining section 123 outputs a control signal 120 to thereby halt the operation of the power amplifier 113. This can prevent the abnormal signal from being sent from the antenna 115.

As described above, when the power amplifier 113 is faulty and distortion occurrence amount is greater than a reference, that fact is detected by the out-band power computing section 119, to output a control signal to the power amplifier 113. This halts the operation of the power amplifier 113, making it possible to prevent radio wave radiation impedimental to the adjacent channel.

EMBODIMENT 2

Figure 2:
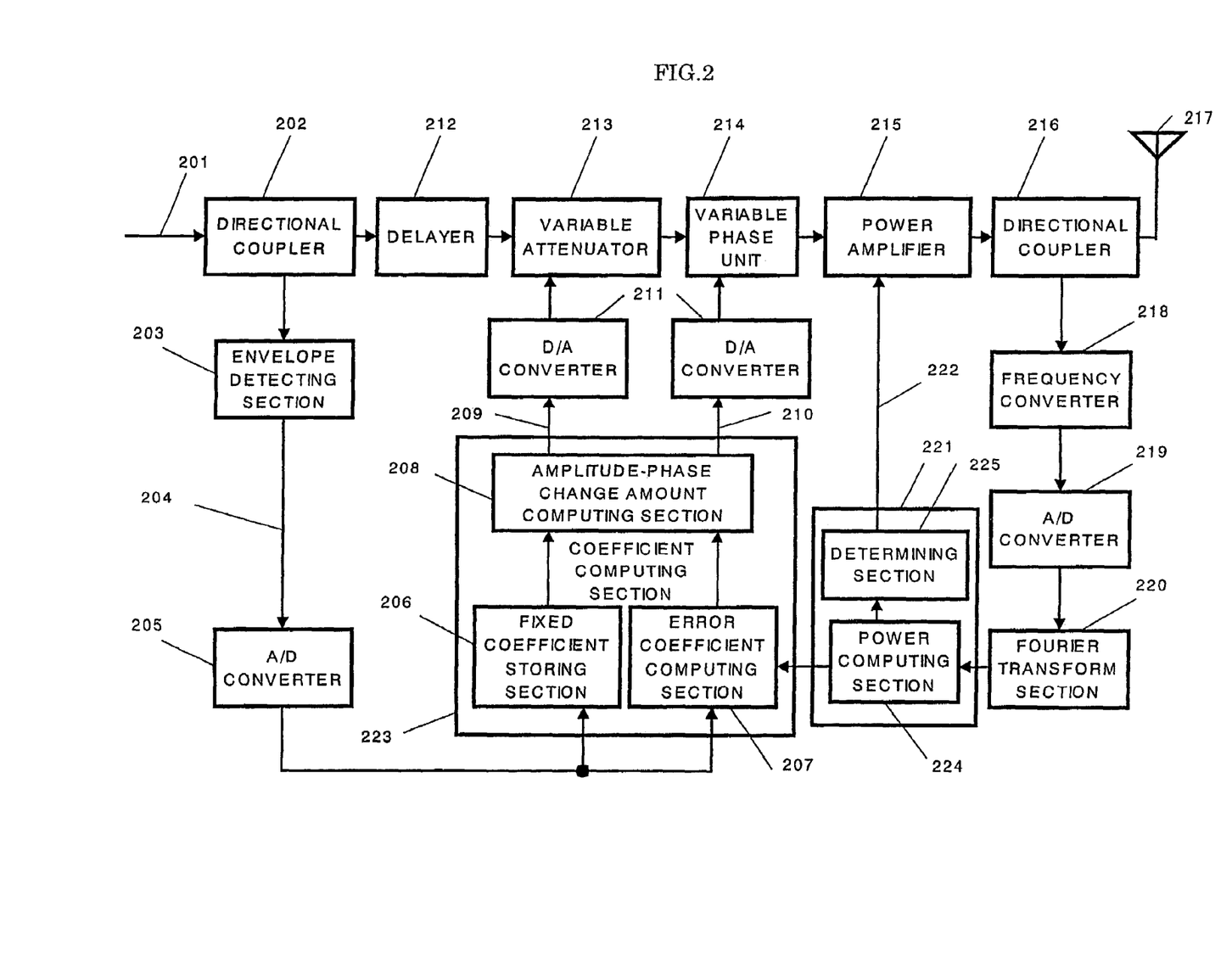
FIG. 2 shows a block diagram of an adaptation-type distortion compensator according to embodiment 2 in the invention.

FIG. 2 is a block diagram of a distortion compensator in an embodiment of the invention. A directional coupler 202 is to distribute a transmission RF signal 201, an envelope detecting section 203 is to output an envelope amplitude 204 of input signal, and an A/D converter 205 is to convert an analog signal into a digital signal.

Meanwhile, a variable attenuator 213 is to control the amplitude of the input signal on the basis of an amplitude change amount 209, which may be a variable amplifier. A variable phase unit 214 is to control the phase of the input signal on the basis of a phase change amount 210. The other configuration is similar to embodiment 1.

Explanation is made on the operation of the distortion compensator thus configured, by using FIG. 2. At first, a transmission RF signal 201 is distributed by the directional coupler 202, one-of whose output is inputted to the envelope detecting section 203. The envelope detecting section 203 outputs an envelope amplitude value 204. The amplitude value 204 is converted by the A/D converter 205 into a digital signal. The fixed-coefficient storing section 206 of the coefficient computing section 223 receives the digital signal and outputs a fixed coefficient in accordance with the amplitude value. 204. Meanwhile, the error-coefficient computing section 207 receives the amplitude value 204 and the integration power of from the out-band power computing section 221, whereby the error-coefficient computing section 207 computes and outputs an error coefficient corresponding to an error between a fixed coefficient to be outputted from the fixed-coefficient storing section 206 and a coefficient for a characteristic reverse to a current input/output characteristic of the power amplifier 215. This error is representative of a change amount in input/output characteristic of the power amplifier 215 due to environmental variation, such as temperature, power voltage, aging and the like similarly to the embodiment 1. Receiving the fixed coefficient and the error coefficient, the amplitude-phase change amount computing section 208 outputs an amplitude change amount 209 and phase-change amount 210. The amplitude change amount 209 and phase change amount 210 is converted by the D/A converter 211 into an analog signal to be inputted to the variable attenuator 213 and variable phase unit 214.

Meanwhile, a suitable delay amount is given by the delayer 212 to the other signal distributed by the directional coupler 202. Herein, the delay amount to be given by the delayer 212 is an amount corresponding to a processing time of from the distribution of the transmission RF signal 201 by the directional coupler 202 to reaching the variable attenuator 213 and variable phase unit 214 through the envelope detecting section 203, the A/D converter 205, the fixed-coefficient storing section 206, error-coefficient computing section 207, the amplitude-phase change amount computing section 208 and the D/A converter 211. The delayed transmission RF signal, is amplitude-controlled in the variable attenuator 213 on the basis of an amplitude change amount 209 value. The output of the variable attenuator 213 is inputted to the variable phase unit 214. In the variable phase unit 214, phase control is carried out on the basis of a value of the phase change amount 215. The phase-controlled signal is amplified by the power amplifier 215 to a desired power value, thus being made into a distortion-offset linear signal. This signal is distributed by the directional coupler 216, one of whose output signals is transmitted as a radio wave from the antenna 217.

The other output signal of the directional coupler 216 is down-converted by the frequency converter 218 into an intermediate frequency band (IF band) or base band. After Fourier-transforming the down-converted signal, the process in the out-band power computing section 221, of up to computing an outer frequency range power in transmission modulation signal band is similar to that of embodiment 1. Similarly to embodiment 1, it is possible to know the amount of a distortion caused in the power amplifier 215 by computing a power through integrating out-band frequency spectrums. Furthermore, an adjacent-channel leak power ratio can be determined by computing a ratio of an integration of frequency spectrums in the transmission modulation signal band and an integration of frequency spectrums in the adjacent channel band.

Similarly to embodiment 1, the integration power outside the transmission modulation signal band is inputted to the error-coefficient computing section 105, whereby the error coefficient is updated by adapting operation. Due to this, a favorable distortion compensating characteristic is available even against the input/output characteristic change of the power amplifier 215 due to environmental fluctuation or a request from the communication system.

As described above, by configuring with a fixed-coefficient, storing section 206 and error-coefficient computing section 207 a coefficient computing section 223 for computing a characteristic reverse in characteristic to an input/output characteristic to/from a power amplifier, it is satisfactory to update the coefficient in a lower degree of polynomial as compared to the configuration in which the coefficient computing section makes computation with one polynomial. Because this can reduce the number of updates, rapid converging is possible on adapting operation.

Meanwhile, in the out-band power computing section 221, similarly to embodiment 1, the power computing section 224 computes an adjacent-channel leak power ratio from a frequency spectrum which is an output signal of the power amplifier 215 and the determining section 225 always determines whether to satisfy a specification required in the system or not. In the case the power amplifier. 215 is faulty and an abnormal signal is outputted, the power amplifier 215 is halted in operation by the control signal 222 from the determining section 225. Accordingly, it is possible to prevent an abnormal signal from being sent from the antenna 217.

The procedure of the above is similar to that of embodiment 1 as shown in FIG. 4. When the power amplifier 215 is faulty and the distortion occurrence amount is greater than a reference, this fact is detected in the out-band power computing section 224 to thereby output a control signal to the power amplifier 215. This halts the operation of, the power amplifier 215, thus preventing radio wave radiation impedimental to the adjacent channel.

INDUSTRIAL APPLICABILITY

As in the above, the present invention is useful for a distortion compensator suited for rapidly converging the adapting operation to follow up the characteristic fluctuation of a power amplifier and preventing the interference to the adjacent channel due to abnormal distortion on the power amplifier.

The invention claimed is:

1. A distortion compensator comprising:
an amplitude-phase controller for controlling an amplitude and phase of an input transmission base-band signal to form a controlled signal;
a quadrature modulator for orthogonally modulating the controlled signal received from the amplitude-phase controller;
a power amplifier for amplifying the quadrature modulated signal received from the quadrature modulator;
a directional coupler for distributing the amplified signal received from the power amplifier as a feedback signal;
a frequency converter for frequency-converting the feedback signal received from the directional coupler;
a Fourier transformer for Fourier-transforming the frequency-converted signal into a frequency spectrum signal;
an out-band power calculator for computing an out-band power outside of a transmission band from the frequency spectrum signal, the out-band power corresponding to a distortion component of the power amplifier;
an amplitude calculator for computing an amplitude value of the input transmission base-band signal;
fixed-coefficient storage for storing characteristics reverse to a pre-measured input/output characteristic of the power amplifier, one of the stored characteristics selected based on the amplitude value;
an error coefficient calculator for computing an error characteristic, the error characteristic computed based on the out-band power from the out-band power calculator and the selected characteristic from the fixed coefficient storage; and
an amplitude-phase change calculator for computing an amplitude change and a phase change based on the selected characteristic from the fixed-coefficient storage and the error characteristic from the error coefficient calculator, and instructing the amplitude-phase controller to carry out the control based on the amplitude change and the phase change.

2. A distortion compensator comprising:
a variable attenuator for controlling an amplitude of an input transmission RF signal to form an amplitude controlled signal;
a variable phase unit for controlling a phase of the amplitude controlled signal received from the variable attenuator to form a controlled signal;
a power amplifier for amplifying the controlled signal received from the variable phase unit;
a directional coupler for distributing the amplified signal received from the power amplifier as a feedback signal;
a frequency converter for frequency-converting the feedback signal received from the directional coupler;
a Fourier transformer for Fourier-transforming the frequency converted signal into a frequency spectrum signal;
an out-band power calculator for computing an out-band power outside of a transmission band from the frequency spectrum signal, the out-band power corresponding to a distortion component of the power amplifier;
an envelope detector for outputting an amplitude value of an envelope of the input transmission RF signal;
fixed coefficient storage for storing characteristics reverse to a pre-measured input/output characteristic of the power amplifier, one of the stored characteristics selected based on the amplitude value;
an error coefficient calculator for computing an error characteristic, the error characteristic computed based on the out-band power from the out-band power calculator and the selected characteristic from the fixed coefficient storage; and
an amplitude-phase change calculator for computing an amplitude change and a phase change based on the selected characteristic from the fixed-coefficient storage and the error characteristic from the error coefficient calculator, and instructing the variable attenuator and the variable phase unit to carry out the control based on the respective amplitude change and the phase change.

3. A distortion compensator according to claim 1, wherein the error coefficient calculator computes a polynomial having, as a variable, the amplitude value of the input transmission base-band signal, to update a coefficient of the polynomial from the out-band power.

4. A distortion compensator according to claim 1, wherein the out-band power calculator includes a power computing section for computing an adjacent channel leak power ratio and a determining section for determining whether the adjacent channel leak power ratio is less than or equal to a predetermined value, to instruct the power amplifier to halt operation when the adjacent channel leak power ratio is greater than the predetermined value.

5. A distortion compensator according to claim 2, wherein the error coefficient calculator computes a polynomial having, as a variable, the amplitude value of the input transmission RF signal, to update a coefficient of the polynomial from the out-band power.

6. A distortion compensator according to claim 2, wherein the out-band power calculator includes a power computing section for computing an adjacent channel leak power ratio and a determining section for determining whether the adjacent channel leak power ratio is less than or equal to a predetermined value, to instruct the power amplifier to halt operation when the adjacent channel leak power ratio is greater than the predetermined value.

* * * * *

UNITED STATES PATENT AND TRADEMARK OFFICE
CERTIFICATE OF CORRECTION

| | | |
|---|---|---|
| PATENT NO. | : 7,248,643 B2 | Page 1 of 1 |
| APPLICATION NO. | : 10/502512 | |
| DATED | : July 24, 2007 | |
| INVENTOR(S) | : Shinichiro Takabayashi et al. | |

It is certified that error appears in the above-identified patent and that said Letters Patent is hereby corrected as shown below:

<u>Page 2, Item (56) References Cited, FOREIGN PATENT DOCUMENTS</u>
Change "WO    WO   00/01065    1/2000"
to -- WO      00/01065    1/2000 --

Signed and Sealed this

Fourth Day of March, 2008

JON W. DUDAS
*Director of the United States Patent and Trademark Office*